(12) United States Patent
Gavish

(10) Patent No.: US 6,957,624 B2
(45) Date of Patent: *Oct. 25, 2005

(54) APPARATUS AND A METHOD FOR FORMING AN ALLOY LAYER OVER A SUBSTRATE

(75) Inventor: Ilan Gavish, Karmiel (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/628,949

(22) Filed: Jul. 28, 2003

(65) Prior Publication Data

US 2004/0016403 A1 Jan. 29, 2004

Related U.S. Application Data

(62) Division of application No. 09/752,492, filed on Dec. 29, 2000, now Pat. No. 6,638,580.

(51) Int. Cl.⁷ .................. C23C 16/00; H01L 21/768
(52) U.S. Cl. .................. 118/723 FI; 118/723 CB; 427/595
(58) Field of Search ............ 118/723 FI, 723 CB, 118/641, 724, 642, 620, 695; 156/345.5

(56) References Cited

U.S. PATENT DOCUMENTS

| | | | |
|---|---|---|---|
| 4,489,478 A | 12/1984 | Sakurai | |
| 4,800,173 A | * 1/1989 | Kanai et al. | ................. 117/99 |
| 4,853,341 A | 8/1989 | Nishioka et al. | |
| 4,873,413 A | 10/1989 | Uesugi et al. | |
| 4,876,112 A | 10/1989 | Kaito et al. | |
| 4,900,695 A | 2/1990 | Takahashi et al. | |
| 4,908,226 A | 3/1990 | Kubena et al. | |
| 4,952,421 A | 8/1990 | Morimoto et al. | |
| 4,962,059 A | 10/1990 | Nishioka et al. | |
| 4,983,540 A | 1/1991 | Yamaguchi et al. | |
| 4,993,361 A | 2/1991 | Unvala | |
| 5,026,664 A | * 6/1991 | Hongo et al. | |
| 5,104,684 A | * 4/1992 | Tao et al. | ................. 427/526 |
| 5,106,764 A | 4/1992 | Harriott et al. | |
| 5,120,925 A | * 6/1992 | Ohnishi et al. | ......... 219/121.12 |
| 5,132,248 A | * 7/1992 | Drummond et al. | ........ 505/325 |
| 5,182,170 A | 1/1993 | Marcus et al. | |
| 5,182,231 A | 1/1993 | Hongo et al. | |
| 5,230,756 A | 7/1993 | Kawasaki et al. | |
| 5,244,828 A | 9/1993 | Okada et al. | |
| 5,342,448 A | 8/1994 | Hamamura et al. | |
| 5,451,260 A | 9/1995 | Versteeg et al. | |
| 5,500,289 A | 3/1996 | Gavish | |

(Continued)

FOREIGN PATENT DOCUMENTS

| | | |
|---|---|---|
| JP | 62-297458 | 12/1987 |
| JP | 3-50949 | 2/1990 |
| JP | 3-285066 | 12/1991 |

*Primary Examiner*—Parviz Hassanzadeh
(74) *Attorney, Agent, or Firm*—Blakely, Sokoloff, Taylor & Zafman LLP

(57) ABSTRACT

One embodiment of the invention involves introducing at least two metals into a chamber for forming an alloy layer over a substrate. This is accomplished by a variety of methods. In one embodiment, at least two metals are mixed and introduced into a chamber in which a focused ion beam contacts the two metals to form at least one alloy layer over a substrate. In another embodiment, at least two precursor gas sources are introduced into the chamber in which each precursor gas source contains a metal. The focused ion beam contacts the two precursor gases to form an alloy layer over the substrate. In yet another embodiment, a second metal layer is formed over a first metal layer to form a multi-metal layer. Thereafter, thermal treatment or introducing a focused ion beam to at least a portion of the multi-metal layer is performed to create at least one alloy layer over the substrate.

14 Claims, 4 Drawing Sheets

U.S. PATENT DOCUMENTS

| | | |
|---|---|---|
| 5,640,667 A | 6/1997 | Freitag et al. |
| 5,700,526 A | 12/1997 | Ximen et al. |
| 5,827,571 A * | 10/1998 | Lee et al. .............. 427/255.37 |
| 5,976,328 A * | 11/1999 | Azuma et al. ......... 204/192.34 |
| 6,066,358 A | 5/2000 | Guo et al. |
| 6,090,458 A * | 7/2000 | Murakami |
| 6,261,850 B1 * | 7/2001 | Marsh |
| 6,309,798 B1 | 10/2001 | Reetz et al. |
| 6,322,672 B1 * | 11/2001 | Shuman et al. |
| 6,376,148 B1 | 4/2002 | Lui et al. |
| 6,492,261 B2 | 12/2002 | Gavish et al. |
| 6,534,133 B1 * | 3/2003 | Kaloyeros et al. .......... 427/576 |
| 6,638,580 B2 * | 10/2003 | Gavish ....................... 427/595 |
| 6,660,631 B1 * | 12/2003 | Marsh ....................... 438/680 |
| 2001/0044207 A1 * | 11/2001 | Marsh |
| 2001/0045525 A1 * | 11/2001 | Gerlach et al. |
| 2002/0197851 A1 * | 12/2002 | Gavish |

\* cited by examiner

APPARATUS AND A METHOD FOR FORMING AN ALLOY LAYER OVER A SUBSTRATE

CROSS-REFERENCE TO RELATED APPLICATION

This application is a divisional application of U.S. patent application Ser. No. 09/752,492, filed Dec. 29, 2000, now U.S. Pat. No. 6,638,580, titled Apparatus and Method for Forming an Alloy Layer Over a Substrate.

FIELD

The invention relates to introducing at least two metals into a chamber and forming a layer over a substrate, and more specifically, to forming an alloy layer over a substrate.

BACKGROUND

Integrated circuit structures are generally formed of numerous discrete devices on a semiconductor chip such as a silicon semiconductor chip. The individual devices are interconnected in appropriate patterns to one another and to external devices through the use of interconnection lines or interconnects to form an integrated device. Typically, many integrated circuit devices are formed on a single structure, such as a wafer substrate and, once formed, are separated into individual chips or dies for use in various environments.

There are several conventional processes for introducing metals such as aluminum, aluminum alloy, or platinum to form an interconnect over a substrate. The metal is generally introduced in the form of a deposition process, (e.g., chemical vapor deposition (CVD), focused ion beam (FIB) deposition) and patterned by way of an etching process into a discrete line or lines. FIB deposition is generally used to introduce thin metal lines to form a metal pattern or layer over a substrate. Typically, a single metal such as platinum, tungsten, or molybdenum is introduced over a substrate by a FIB deposition system. Another process for introducing a metal interconnect, particularly copper or its alloy over a substrate is the damascene process. The damascene process introduces copper interconnect according to a desired pattern previously formed in a dielectric material over a substrate.

Yet another process is FIB metal deposition which is generally used to introduce thin metal lines or arbitrary patterns as a layer over a substrate. FIB deposition is used for modification of small metallic structures such as the modification of existing interconnects in integrated circuits.

One disadvantage to these approaches is that the interconnect that is formed on the substrate has a relatively high electrical resistance such as 160 ohm-centimeters (ohm-cm) to 200 ohm-cm. This may be due to the surface property that results from the use of a single metal that provides poor bulk electrical resistance or to the existence of elements like carbon which originate from the precursor. Generally, the resistance of an alloy such as tungsten-carbon-cobalt is lower than that of metal alloy such as tungsten-carbon. J. Brooks, *Properties of Tungsten Carbide Cobalt Alloy*, 232 (1994). What is needed is a process and a tool that allows for the introduction of metals to form a layer over a substrate that decreases the electrical resistance of the layer.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

One embodiment of the invention involves introducing at least two metals for forming an alloy layer over a substrate. This is accomplished by a variety of methods. In one embodiment, at least two metals are premixed and introduced into a chamber in which a focused ion beam contacts the two metals to form at least one alloy layer over a substrate. In another embodiment, at least two precursor gases are introduced into the chamber in which each precursor gas contains at least one different metal. The focused ion beam contacts the two precursor gases to form an alloy layer over the substrate.

In yet another embodiment, a second metal layer is formed over a first metal layer to create a multi-metal layer over a substrate. Thereafter, the multi-metal layer is either thermally treated or a focused ion beam is applied to at least a portion of the multi-metal layer. Thermally treating or applying a focused ion beam to the multi-metal layer results in the metal in the first metal layer reacting with the metal in the second metal layer. This reaction forms an alloy layer over the substrate. Each of these methods of forming an alloy layer reduces the electrical resistance typically found in a deposited metal layer of conventional processes.

The metals selected for this process may include cobalt, metal carbonyl, molybdenum, tungsten, or a mixture of cobalt, molybdenum, tungsten or any other suitable metal. In the context of the description of the invention, the words cobalt, molybdenum, or tungsten are intended to refer to both pure cobalt, molybdenum, or tungsten and to their alloys that are suitable as integrated circuit interconnect material.

In another aspect, a system is disclosed for introduction of at least two metals into a chamber using the methods described above. In one embodiment, the system includes a chamber configured to house a substrate, such as a semiconductor wafer, a discrete chip or a die, and an energy source. A system controller is configured to control the introduction of metals such as cobalt, metal carbonyl, molybdenum, tungsten, or a mixture of two or more of these metals into an energy source such as a FIB. The system controller also controls the introduction of the energized metals from the energy source over a substrate. A memory coupled to the controller includes a machine-readable medium having a machine-readable program embodied therein for directing the operation of the system. The machine-readable program includes instructions for controlling the amount of metal introduced into the energy source and controlling the energy source that introduces the energized metal into the chamber. In the discussion that follows, FIG. 1 illustrates FIB deposition system 103 for FIB deposition and FIGS. 2–6 illustrate the formation of alloy layers over a substrate.

Figure 1:
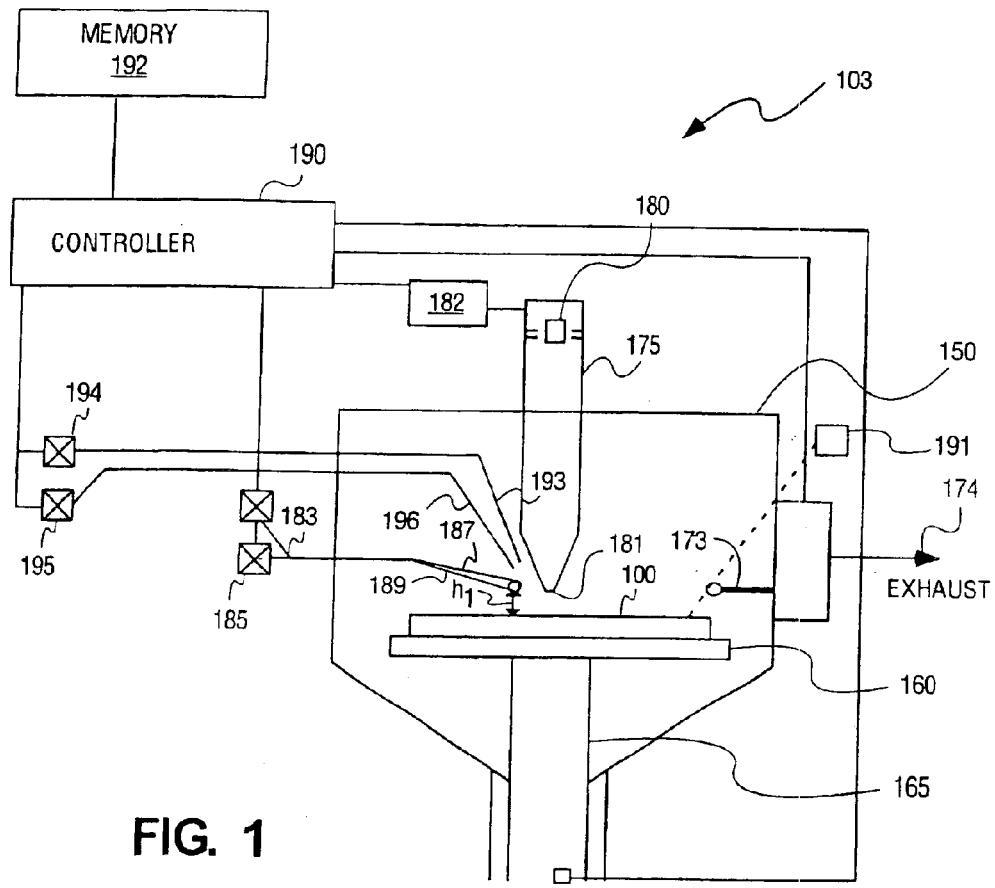
FIG. 1 illustrates a schematic cross-sectional view of a processing chamber suitable for performing the modification described in reference to FIGS. 2–6 in accordance with one embodiment of the invention.

FIG. 1 illustrates a schematic cross-sectional view of a FIB deposition system 103 that is used to introduce more than one metal over substrate 100 to form an alloy layer over substrate 100. FIB deposition system 103 includes chamber 150, first and second reservoirs (183, 185), first and second precursor gas sources (194, 195), third and fourth inlets (193, 196), FIB column 175, heat source 191, and controller 190 for FIB deposition of metals such as cobalt, metal carbonyl, molybdenum, tungsten or other suitable metals over substrate 100. Each of these devices is described below.

Chamber 150 is typically constructed of aluminum or steel and has a suitable inside volume to house a substrate, such as substrate 100. In FIG. 1, substrate 100 is seated on substrate processing stage 160 that itself is coupled to shaft 165 to support substrate processing stage 160 inside chamber 150.

Coupled to chamber 150 is first reservoir 183 and second reservoir 185. First reservoir 183 and second reservoir 185 are configured to contain a different metal for delivery of the metal or metals to chamber 150 in, for example, a phase such as a vapor phase. Techniques for placing metals into a vapor phase are known in the art and details of this process are not presented to avoid obscuring techniques of the invention.

First inlet 187 connected to first reservoir 183 and second inlet 189 connected to second reservoir 185 are configured to release the metal precursor in a vapor phase in the path of the FIB over substrate 100. In one embodiment, first inlet 187 and second inlet 189 should be positioned ($h_1$) about 100 microns from the surface of substrate 100 and adjacent FIB aperture 181. FIG. 1 also shows that the first reservoir 183 and second reservoir 185 are connected to controller 190. Controller 190 controls the addition of the metals from first reservoir 183 and second reservoir 185 to chamber 150 and may automatically adjust first inlet 187 and second inlet 189. Absent automated process control, first inlet 187 and second inlet 189 may be positioned manually.

Third and fourth inlets (193, 196) connected to first and second precursor gas sources (194, 195) are conduits configured to release metal precursors in a gaseous phase to chamber 150. First and second precursor gas sources (194, 195) each deliver one precursor gas that includes at least one or more metals. Controller 190 also controls the addition of first and second precursor gases into chamber 150 and may automatically adjust third and fourth inlets (193, 196). Third and fourth inlets may also be manually adjusted.

There are numerous methods in which more than one metal may be introduced into chamber 150 in order to form an alloy layer over a substrate. One method is to premix the metals or organic precursors containing metals (e.g., tungsten hexacarbonyl, methylcyclopentadienyl trimethyl platinum, etc.) that may be in a powder form to a desired ratio by volume or by weight. For example, in terms of the volume of first reservoir 183 and second reservoir 185, one liter of powder may be parsed into one-third for one metal and two-thirds for the other metal. The mixture of metals is then placed into one or both of first and second reservoirs (183, 185) for injection of the metals through first inlet 187 or second inlet 189 into chamber 150. Alternatively, prealloyed precursors containing more than one metal may be prepared and placed into first or second reservoir (183, 185). Prealloyed precursors are created from conventional techniques such as mechanical alloying, jet mill processes, or other suitable methods. The combination of these two metals is placed in the path of the FIB and after the FIB contacts the metal precursors, the metals react and form an alloy layer over substrate 100.

In another embodiment, each metal (or metal precursors) may be separately introduced at about the same time to chamber 150 to form an alloy layer, during the reaction with the FIB, over substrate 100. For example, first inlet 187 to chamber 150 may introduce cobalt (e.g., cobalt carbonyl) and second inlet 189 connected to chamber 150 introduces molybdenum. The FIB strikes the metals (or metal precursors) causing the metals to react and form an alloy over substrate 100. In this embodiment, each metal may be subject to particular conditions for that metal since each metal is separately introduced into chamber 150.

In yet another embodiment, metals (or metal precursors) may be injected as a mixture or as a single metal (or metal precursor) in a gaseous phase into chamber 150 below the FIB through first precursor gas source 194 and second precursor gas source 195 by way of third and fourth inlets (193, 196). If the metals are introduced into chamber 150 in the gaseous phase, the gaseous phase then becomes a vapor based upon the pressure in the chamber. It will be appreciated that each metal precursor may have a different vapor pressure that may affect the amount of metal or metals that are introduced into chamber 150 illustrated in FIG. 1. As a result, the amount of each metal (or metal precursor) introduced into chamber 150 may depend upon the vapor pressure of that particular metal precursor. For example, the vapor pressure of di-cobalt octacarbonyl precursor $Co_2(CO)_8$ is about three times that of tungsten hexacarbonyl precursor $W(CO)_6$. Accordingly, approximately two times of the amount of tungsten hexacarbonyl must be added to di-cobalt octacarbonyl to achieve about 10% by weight of cobalt in the deposited material alloy.

Once the metals (or metal precursors) in the vapor phase have been introduced into chamber 150, the FIB may be activated through FIB column 175 or, alternatively, the FIB may be continuously activated. FIB column 175 is coupled to chamber 150 and enters through a top surface of the otherwise sealed chamber. FIB column 175 includes physical delivery system 180 for introducing a species, including but not limited to a gallium species, and energy source 182 (e.g., 50 kV HV power supply) for ionizing the species and delivering the species to the substrate. The amount of species introduced is also regulated by FIB aperture(s) 181 at the base of FIB column 175.

In one embodiment, FIB column 175 is a Micron 9800FC column produced by FEI Corporation of Hillsboro, Oreg. (www.feico.com). It is to be appreciated that other FIB columns may be similarly suitable.

For a 0.10 micron thick interconnect, an acceleration voltage or energy source for FIB column 175 in the range of 30–50 kilovolts (kV) is suitable. In one example, the beam characteristics of 50 kV for a Micron 9800FC are 569 picoamps (pA) with a pixel spacing of 0.025 microns by 0.025 microns. A chamber pressure of about $1 \times 10^{-7}$ Torr established.

In another embodiment of introducing metals to chamber 150 to form an alloy layer, at least one metal is introduced through one of the techniques described herein followed by another metal. In this embodiment, a second metal line or a second metal layer is formed over the first metal line or the first metal layer thereby forming a multi-metal layer over a substrate. This multi-metal layer is then exposed to an alloy process. The alloy process includes either thermal treatment (e.g., ambient heat, localized heating) of the multi-metal layer or exposure of the multi-metal layer to the FIB. These alloy processes cause the first metal line or first metal layer to react with the second metal line or second metal layer to form an alloy layer over the substrate.

Thermal treatment is created by heat source 191 and is applied to a multi-metal layer formed over substrate 100 in order to form an alloy layer. Heat source 191 may be either external or internal to FIB deposition system 103. Heat source 191 may be a Light Amplification through Stimulated Emission of Radiation (laser), oven, local ion scan bombardment, current forced through the metal line by an external power source, or other suitable heat sources. The amount of heat that must be applied to an alloy layer is dependent, in part, upon the metals of which the alloy layer is composed. Generally, if a laser is used, about 0.3 to 5 watts of heat is applied. The laser stage speed is typically in the range of 0 to about 250 $\mu$/sec. The resistance of the alloy layer that is created may be about 10 $\mu\Omega \times$cm to about 120 $\mu\Omega \times$cm.

In comparison, ovens generally heat an inert gas (e.g., argon) at a temperature up to 2000$_i$C. in which a layer or layers are heated. The substrate itself is protected from the heat by the combination of the accuracy of the locally supplied heat and/or a heat exchanger (not shown). The heat exchanger, connected to substrate 100, is configured to remove heat from substrate 100.

Coupled to chamber 150 is controller 190. Controller 190 includes a processor (not shown) and memory 192. Memory 192 includes instruction logic accessible by the processor to control the introduction of metal(s) and the FIB into chamber 150. Memory 192 also includes instruction logic for applying heat to a multi-metal layer over substrate 100 to form an alloy layer. Alternatively, memory 192 includes instruction logic to apply the FIB to the multi-metal layer to form an alloy layer.

Controller 190 may control a variety of other parameters. For example, controller 190 may control the movement of heat source 191. Alternatively, substrate 100 of FIG. 1 itself may be moved to heat another discrete area on a layer. It is to be appreciated, however, that with a suitable heat source, an entire interconnect area may be heated at once.

Controller 190 also controls vacuum source 173 to ensure gases generated in chamber 150 from heating a layer over substrate 100 are removed. In this embodiment, gases such as carbon dioxide and carbon monoxide that may be generated from heating the multi-metal layer are exhausted through exhaust 174. Other suitable instructions in controller 190 are used to control other applicable control parameters.

Figure 2:
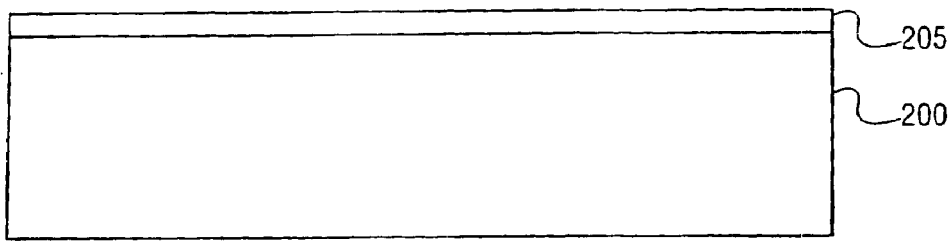
FIG. 2 illustrates a schematic cross-sectional view of a portion of a substrate in accordance with one embodiment of the invention.

Given the explanation of FIB deposition system 103, the description that follows in FIGS. 2 through 6 illustrates the formation of an integrated circuit structure in accordance with one embodiment of the invention. FIG. 2 illustrates a schematic cross-sectional view of a portion of typical semiconductor substrate or wafer 200 in accordance with one embodiment of the invention. Substrate 200 generally comprises silicon or other suitable material. Typically, substrate 200 includes dielectric layer 205. Dielectric layer 205 may include materials such as silicon dioxide, silicon nitride, or other suitable material.

Figure 3:
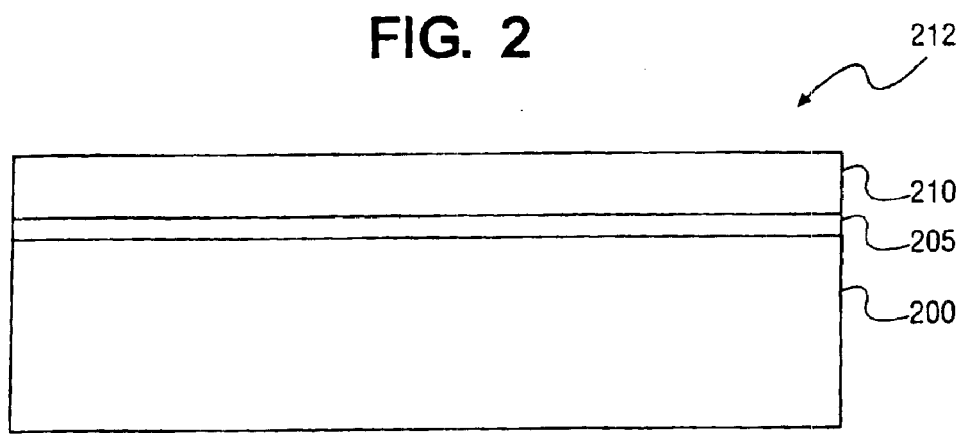
FIG. 3 illustrates a schematic cross-sectional view of metals introduced over the substrate of FIG. 2 in accordance with one embodiment of the invention.

FIG. 3 illustrates a schematic cross-sectional view of metals introduced onto substrate 200 illustrated in FIG. 2 using FIB deposition. At least one or more metals such as the cobalt, metal carbonyl, molybdenum, tungsten or other suitable metal is introduced to chamber 150. The metals may be introduced into chamber 150 by premixing metal precursors in a powder form or using prealloyed precursors and placing the metal precursors in a vapor phase. Alternatively, at least two metal precursors may be introduced to chamber 150 in a gaseous phase that is subsequently converted to a vapor phase.

A dose of the FIB may then be applied to the metals in the vapor phase. A dose is the rate of beam energy applied in nano-coulombs per square micron (nC/$\mu$m$^2$) of the FIB that contacts the metals in the vapor phase resulting in these metals forming an alloy layer such as first layer 210 over dielectric layer 205 at a rate of about 0.05 $\mu$/min. In still another embodiment, single metals or two or more metals may be introduced into chamber 150 using techniques described herein resulting in the formation of a first metal layer over a substrate and a second metal layer over the first metal layer thereby creating a multi-metal layer. The multi-metal layer is then either hit by the FIB causing a reaction between the first metal layer and the second metal layer to form an alloy layer or the multi-metal layer is thermally treated to form an alloy layer.

If the FIB deposition system is used, the depth of first layer 210 is determined by the dose that is given to the metal molecules by the FIB deposition system. Typically, first layer 210 of structure 212 has a thickness of about 0.1 $\mu$m. First layer 210 is an alloy that includes, for example, two metals such as cobalt and molybdenum that are introduced onto substrate 200 through FIB deposition. It will be appreciated that first layer 210 may also comprise another selection of metals.

Figure 4:
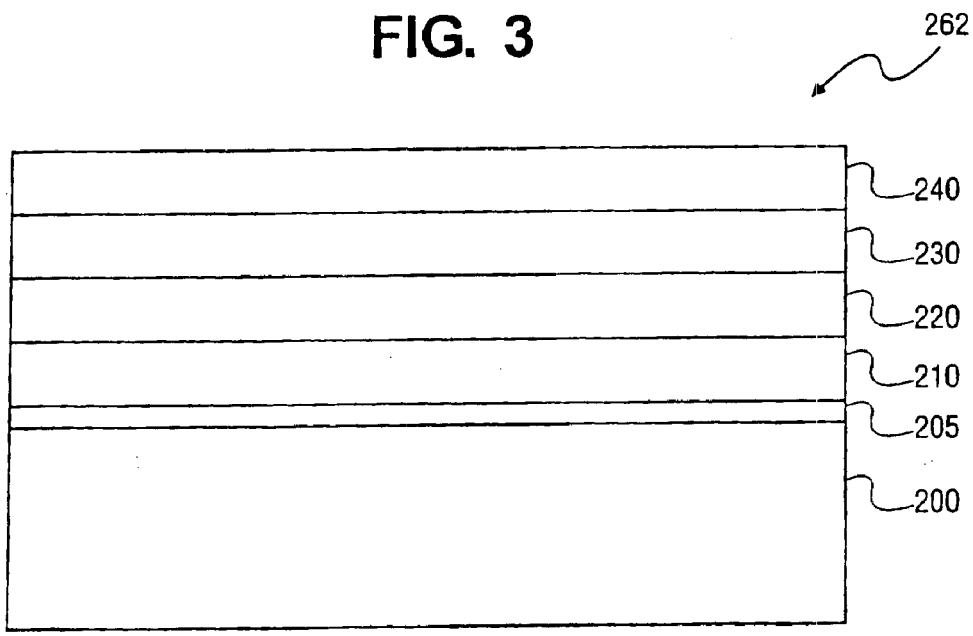
FIG. 4 illustrates a schematic cross-sectional view of metals introduced over the substrate of FIG. 3 in accordance with one embodiment of the invention.

Additional layers may be formed over first layer 210 as shown by second, third, and fourth layers (220, 230, 240) of structure 262 of FIG. 4 using the techniques disclosed herein. Additional layers may include more than one metal such as cobalt, metal carbonyl, molybdenum, tungsten, or other suitable metals. For example, second layer 220 may include metals such as tungsten carbonyl and tungsten; third layer 230 may include metals such as cobalt and molybdenum; and fourth layer 240 may include metals such as tungsten and tungsten carbonyl. Moreover, the thickness of these layers may range from about 0.1 $\mu$m to about 0.3 $\mu$m.

Figure 5:
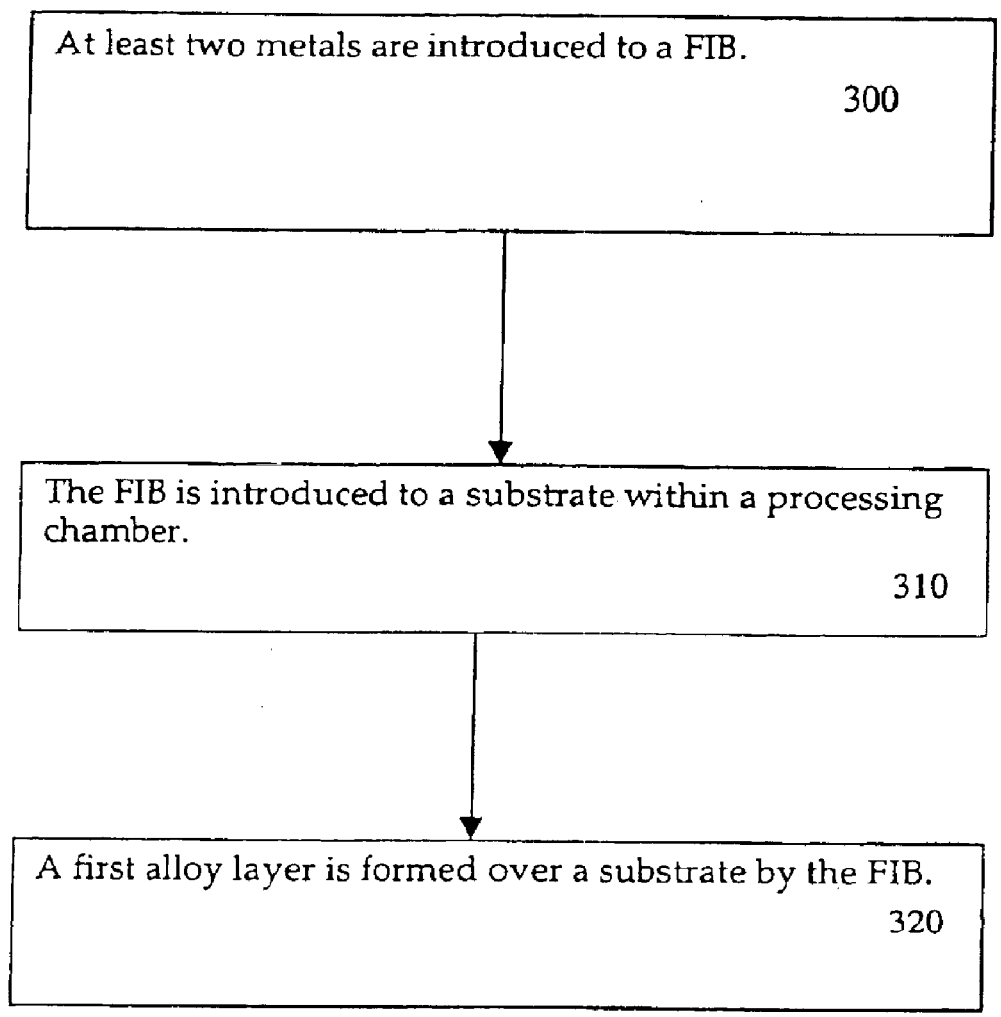
FIG. 5 illustrates a flow diagram of one method of focused ion beam deposition of an alloy layer over a substrate in accordance with one embodiment of the invention.
Figure 6:
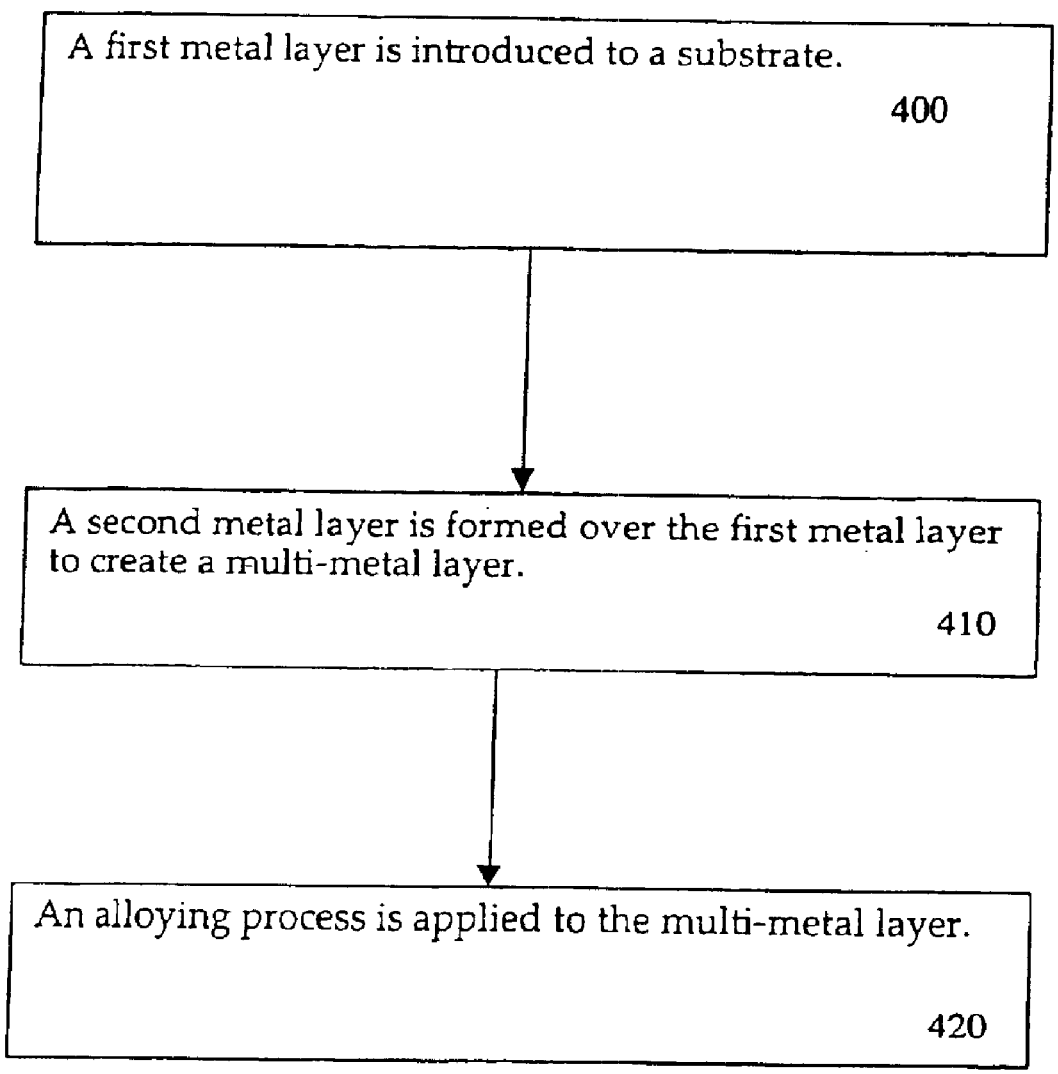
FIG. 6 illustrates a flow diagram of one method of forming an alloy layer over a substrate by heating a multi-metal layer in accordance with one embodiment of the invention.

FIGS. 5 and 6 are flow diagrams showing various methods for forming an alloy layer. FIG. 5 illustrates a flow diagram of one method of FIB deposition of at least two metals to form an alloy layer over a substrate in accordance with one embodiment of the invention. At block 300, at least two metals are introduced to a FIB. In one embodiment, the metals are premixed in a powder form and then introduced into the chamber in a vapor phase. In another embodiment, prealloyed precursors are introduced into the chamber in the vapor phase. In yet another embodiment, two or more precursor gases are introduced into the chamber. Each precursor gas contains at least one metal. The precursor gases entering the chamber change to the vapor phase based upon the pressure in the chamber. At block 310, the FIB is introduced to a substrate within a processing chamber. At block 320, a first alloy layer is formed over a substrate by the FIB. The resistance in the layer may range from about 120 ohm-cm to about 10 ohm-cm.

FIG. 6 illustrates a flow diagram of one method of forming an alloy layer from a multi-metal layer over a substrate in accordance with one embodiment of the invention. At block 400, a first metal layer or a first metal line is introduced to a substrate. At block 410, a second metal layer or a second metal line is formed over the first metal layer or first metal line creating a multi-metal layer. At block 420, an alloying process is applied to the multi-metal layer causing the metals to react and form an alloy layer. The alloying process includes thermal treatment (e.g., ambient heating, local heating) or applying a FIB to the multi-metal layer or multi-metal line. The resistance in the layer may range from about 120 ohm-cm to 10 ohm-cm.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A system comprising:
   a chamber configured to house a substrate for processing;
   an energy source coupled to the chamber;
   a system controller configured to control the introduction of at least two metal constituents to a focused ion beam and to control the introduction of the focused ion beam; and
   a memory coupled to the controller comprising a computer-readable medium having a computer-readable program embodied therein for directing operation of the system, the computer-readable program comprising:
   instructions for controlling the energy source and for introducing the metal constituents by mixing the at least two metal constituents and introducing the at least two metal constituents into a chamber in which a focused ion beam contacts the at least two metal constituents to form a first alloy layer over a substrate.

2. The system of claim 1, wherein the program further comprises instructions for controlling the introduction of each of the at least two metal constituents selected from the group consisting of cobalt, metal carbonyl, molybdenum and tungsten.

3. The system of claim 2, wherein the program further comprises instructions for forming more than one alloy layer, wherein a second alloy layer is formed over the first alloy layer.

4. The system of claim 3, wherein the second alloy layer is created from a second multi-metal layer which is exposed to an alloy process.

5. The system of claim 4, wherein the alloy process involves the second multi-metal layer exposed to one of a thermal treatment and to a focused ion beam.

6. A system comprising:
   a chamber configured to house a substrate for processing;
   an energy source coupled to the chamber;
   a system controller configured to control the introduction of at least two metal constituents to a focused ion beam and to control the introduction of the focused ion beam; and
   a memory coupled to the controller comprising a computer-readable medium having a computer-readable program embodied therein for directing operation of the system, the computer-readable program comprising:
   instructions for controlling the energy source and for introducing the metal constituents by introducing at about the same time at least two precursor gas sources in which each precursor gas source contains a respective one of the at least two metal constituents and the focused ion beam contacts the at least two precursor gases to form a first alloy layer over a substrate.

7. The system of claim 6, wherein each of the at least two metal constituents is selected from the group consisting of cobalt, metal carbonyl, molybdenum and tungsten.

8. The system of claim 7, further comprising:
   forming more than one alloy layer, wherein a second alloy layer is formed over the first alloy layer.

9. A system comprising:
   a chamber configured to house a substrate for processing;
   an energy source coupled to the chamber;
   a system controller configured to control the introduction of at least two metal constituents to a focused ion beam and to control the introduction of the focused ion beam; and
   a memory coupled to the controller comprising a computer-readable medium having a computer-readable program embodied therein for directing operation of the system, the computer-readable program comprising:
   instructions for controlling the energy source and for introducing the metal constituents by forming a first layer of a first of the at least two metal constituents and a second layer of a second of the at least two metal constituents to create a multi-metal layer and performing one of thermal treatment and introducing focused ion beam to at least a portion of the multi-metal layer to form a first alloy layer over a substrate.

10. The system of claim 9, wherein each of the at least two metal constituents is selected from the group consisting of cobalt, metal carbonyl, molybdenum and tungsten.

11. The system of claim 10, further comprising:
    forming more than one alloy layer, wherein a second alloy layer is formed over the first alloy layer.

12. The system of claim 11, wherein the second alloy layer is created from a second multi-metal layer which is exposed to an alloy process that involves the second multi-metal layer exposed to one of a thermal treatment and to a focused ion beam.

13. The system of claim 9, wherein the instructions for forming a first and second layer include instructions to heat the first and second layer sufficiently to re-crystallize a metal component of the at least one metal formed in the at least one of the first layer and the second layer.

14. The system of claim 9, wherein the instructions for forming a first and second layer include instructions for controlling one of a laser, a continuous wave laser, a pulsed laser, and an argon laser to heat at least one of the first layer and the second layer.

* * * * *